United States Patent

Fuse

[11] Patent Number: 5,933,756
[45] Date of Patent: *Aug. 3, 1999

[54] FABRICATION PROCESS OF A SEMICONDUCTOR DEVICE HAVING A MULTILAYERED INTERCONNECTION STRUCTURE

[75] Inventor: Akihiro Fuse, Natori, Japan

[73] Assignee: Ricoh Company, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/730,505

[22] Filed: Oct. 11, 1996

[30] Foreign Application Priority Data

Oct. 18, 1995 [JP] Japan ................................. 7-296228

[51] Int. Cl.⁶ .................................................. H01L 21/441
[52] U.S. Cl. ........................... 438/640; 438/685; 438/644; 204/192.32
[58] Field of Search ........................... 257/774; 438/195, 438/194, 41, 615, 673, 701, 713, 740, 640, 685, 644

[56] References Cited

U.S. PATENT DOCUMENTS

| 4,933,297 | 6/1990 | Lu | 438/41 |
|---|---|---|---|
| 5,091,049 | 2/1992 | Campbell et al. | 156/643 |
| 5,286,675 | 2/1994 | Chen et al. | 438/195 |
| 5,371,042 | 12/1994 | Ong | 438/194 |
| 5,475,266 | 12/1995 | Rodder | 257/774 |
| 5,519,239 | 5/1996 | Chu | 257/774 |

FOREIGN PATENT DOCUMENTS

| 2064922 | 10/1993 | Canada | 257/774 |
|---|---|---|---|
| 2-281757 | 11/1990 | Japan | 257/774 |
| 2281757 | 11/1990 | Japan . | |
| 5121564 | 5/1993 | Japan . | |

*Primary Examiner*—Olik Chaudhuri
*Assistant Examiner*—Kurt Eaton
*Attorney, Agent, or Firm*—Cooper & Dunham LLP

[57] ABSTRACT

A method of forming a multilayer interconnection structure includes the steps of forming a contact hole in an interlayer insulation film, depositing the contact hole by a conductive plug of a refractory element, applying a sputter-etching process to the interlayer insulation film to form a tapered part at a top part of the contact hole while using the conductive plug as an etching stopper, and filling the tapered part of the contact hole by a conductor material by a sputtering process.

8 Claims, 7 Drawing Sheets

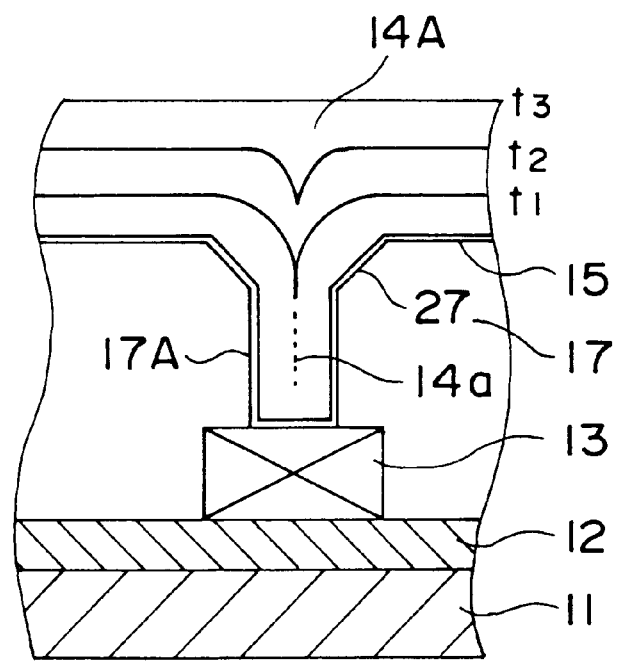
F I G. 6A
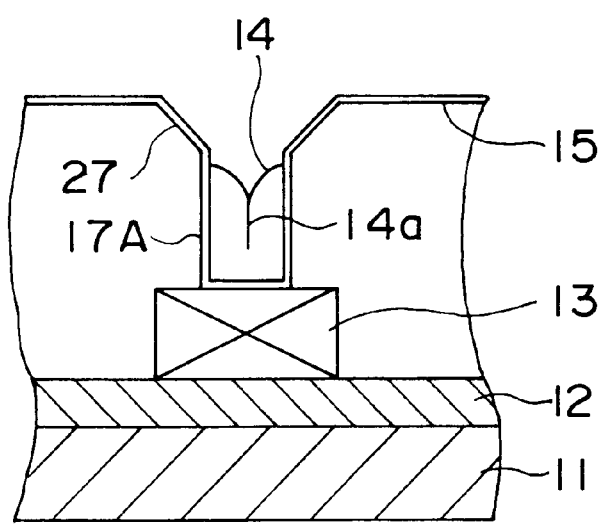
F I G. 6B

FABRICATION PROCESS OF A SEMICONDUCTOR DEVICE HAVING A MULTILAYERED INTERCONNECTION STRUCTURE

BACKGROUND OF THE INVENTION

The present invention generally relates to fabrication of semiconductor devices including integrated circuits and more particularly to a fabrication process of a semiconductor device having a multilayer interconnection structure.

Semiconductor integrated circuits generally have a multilayer interconnection structure. In a multilayer interconnection structure, a conductive region formed in a substrate or a lower conductor pattern forming a part of the multilayer interconnection structure, is connected to an upper conductor pattern via a contact hole formed in an intervening interlayer insulation film, wherein the upper conductor pattern and the interlayer insulation film form the multilayer interconnection structure together with the lower interconnection pattern and the contact hole.

With increasing miniaturization of semiconductor devices and associated increase of the integration density of semiconductor integrated circuits, in which such miniaturized semiconductor devices are included, there emerges a difficulty in achieving a reliable electrical interconnection by way of a conventional sputtering process of Al alloys. More specifically, the Al-alloy layer formed as a result of such a sputtering process tends to show a poor step coverage when filling miniaturized contact holes that have a large aspect ratio.

In order to overcome the problem of poor reliability of electrical contact in such a miniaturized multilayer interconnection structure, it is practiced to fill the contact hole by a conductive material by a vapor phase deposition process and provide the upper interconnection pattern in contact with such a conductive material filling the contact hole. By using such a vapor phase deposition process, it is possible to deposit a conductive material inside a deep contact hole in conformity with the shape thereof even when the contact hole has a large aspect ratio. On the other hand, the conductive material that can be deposited by such a vapor phase deposition process is limited. Typically, W is used for this purpose.

FIG. 1 shows the structure of such a conventional multilayer interconnection structure.

Referring to FIG. 1, the multilayer interconnection structure is formed on a substrate or a semiconductor layer 41 that carries an insulation layer 42 typically an oxide layer thereon, and includes a lower conductor pattern 43 covered by an interlayer insulation film 30. The interlayer insulation film 30 is formed with a contact hole 30A exposing a part of the lower conductor pattern 43, and the contact hole 30 is filled by a conductive plug 32 typically of W. Further, an upper conductor pattern 37 typically of an Al alloy is formed on the insulation film 30 in contact with the conductive plug 32. In the example of FIG. 1, an adhesion layer 31 of a Ti alloy or TiN is provided between the insulation film 30 and the interconnection pattern 37.

In such a structure, it is generally possible to fill the contact hole 30A without encountering the problem of poor step coverage, by using a vapor phase deposition process for the formation of the conductive plug 32.

In the contact structure of FIG. 1, however, there still arises a problem of poor step coverage associated with the incomplete filling of the contact hole 30A by the W plug 32.

In FIG. 1, it will be noted that the W plug 32 fills only a part of the contact hole 30A. Because of this, it is necessary that the Al-alloy pattern 37 fills the upper part of the contact hole 30A, while filling of the contact hole 30A having such a large aspect ratio by a sputtering process is still difficult, although the degree of difficulty is reduced as compared with the case of filling the entire contact hole 30A.

FIG. 2 shows the cross section of a contact hole having an aspect ratio of 1 by an Al-alloy layer deposited by a sputtering process, wherein it will be noted that the opening at the top edge of the contact hole becomes smaller with increasing thickness of the Al-alloy layer deposited on the insulation layer. On the other hand, no substantial growth occurs for the Al-alloy layer covering the bottom part, particularly the side wall of the contact hole. In the example of FIG. 3, it should be noted that the contact hole is defined by a vertical side wall.

The reason why filling of the contact hole by the W plug 32 becomes incomplete in the structure of FIG. 1 will now be explained.

Referring to FIG. 3A showing the process of forming such a plug 32, a W layer 32' is deposited on the interlayer insulation film 30 covered by the adherence film 31. In such a multilayer interconnection structure, it should be noted that there generally exist an irregularity on the top surface of the interlayer insulation film 30, reflecting a structure underlying the insulation film 30. In other words, the top surface of the insulation film 30 is not completely flat but there may be a depression 33 of which depth may reach as much as several hundred nanometers.

Next, in the step of FIG. 3B, the W layer 32' is subjected to an etch-back process, wherein the etch-back process is continued until the adhesion layer 31 on the top surface of the interlayer insulation film 30 is exposed as indicated in FIG. 3C. Thereby, the W plug 32 is obtained in the contact hole 30A.

In the state of FIG. 3C, it should be noted that, while the W layer 32' is removed from the majority of the top surface of the interlayer insulation film 30, the W layer 32' does remain in the foregoing depression 33 to form a W pattern 34 therein. As such a W pattern 34 may cause an unwanted short-circuit, it has been necessary to continue the etch-back process, until the W pattern 34 is removed completely from the entire surface of the layer 30. However, such an excessive etch-back process inevitably causes an excessive etch-back also in the W plug 32 filling the contact hole 30A. Thereby, an unfilled space 35 is formed inevitably on the top part of the plug 32.

It will be noted that the more the undulation of the interlayer insulation film 30, the more the proportion of the unfilled space 35 in the contact hole 30A. Thus, the foregoing problem of poor step coverage of the upper conductor pattern 37 appears conspicuous particularly in the multilayer interconnection structure including two or more interlayer insulation layers.

In order to overcome the foregoing problem, the Japanese Laid-open Patent Publication 5-121564 describes a process to etch-back the interlayer insulation film 30 subsequently to the step of FIG. 3D, such that the interlayer insulation film 30 has a flush surface with the conductor plug 32. However, such an etching of the insulation film uniformly over a wide area is difficult to achieve due to the problem of local fluctuation of the etching rate, and there is a tendency that severe irregularity appears on the top surface of the interlayer insulation film 30 as a result of such an etching. Further, such a conventional process requires formation of a deep contact hole in the insulation film before it is etched to the desired thickness, while exposure of such a deep contact hole is substantially difficult when a high resolution exposure system is used. In conclusion, the process of the foregoing prior art is difficult to implement in the real production process of semiconductor devices and integrated circuits.

It is of course possible to planarize the structure of FIG. 3D by a chemical mechanical polishing (CMP) process. In such a case, the depression 33 is eliminated successfully together with the residual W pattern 34, and the problem of incomplete filling of the contact hole 30A by the W plug 32 is avoided. However, such a CMP process has to be conducted outside the deposition chamber in which the deposition is conducted, and the deposition process conducted therein for forming the multilayer interconnection structure is inevitably interrupted. As a consequence, the throughput of fabrication of the semiconductor integrated circuit is deteriorated.

SUMMARY OF THE INVENTION

Accordingly, it is a general object of the present invention to provide a novel and useful fabrication process of a semiconductor device and an integrated circuit device wherein the foregoing problems are eliminated.

Another object of the present invention is to provide a semiconductor device having a reliable multilayer interconnection structure with low cost, by improving the step coverage of a metal layer in the multilayer interconnection structure by a simple process.

Another object of the present invention is to provide a method of fabricating a semiconductor device, said semiconductor device comprising a substrate and an interconnection structure provided on said substrate, said interconnection structure including an insulation film and an opening formed in said insulation film such that said opening extends from an upper major surface of said insulation film toward a lower major surface of said insulation film, said method comprising the steps of:

(A) filling said opening by a conductive material such that said conductive material fills said opening from a bottom edge of said opening to a level below a top edge of said opening;

(B) applying, after said step (A), a sputter-etching process to said insulation film, such that said upper edge of said opening is removed, said contact hole thereby forming a tapered part above said level, such that a diameter of said opening increases continuously and gradually, in said tapered part, toward said upper major surface of said insulation film;

(C) depositing, after said step (B), a conductor layer on said insulation film such that said conductor layer fills said tapered part of said opening in contact with said conductive material filling said opening.

Another object of the present invention is to provide a semiconductor device, comprising:

a substrate;

an interlayer insulation film provided on said substrate;

a contact hole formed in said interlayer insulation film, such that said contact hole extends from an upper major surface of said interlayer insulation film toward a lower major surface of said interlayer insulation film, said contact hole exposing a conductive pattern;

a tapered part formed in a top part of said contact hole, such that said tapered part is exposed at said upper major surface of said interlayer insulation film and such that said tapered part has a gradually increasing diameter toward said upper major surface of said interlayer insulation film;

a conductive plug filling said contact hole at a part locating below said tapered part; and a conductor layer provided on said upper major surface of said interlayer insulation film, said conductor layer filling said tapered part of said contact hole.

According to the present invention, the upper edge of the opening, which acts as a contact hole or via hole of the multilayer interconnection structure, is successfully rounded by applying a sputter etching process, after the opening is filled partially by the conductive material such as W. By depositing a conductor layer of Al or an Al-alloy on such a structure, it is possible to achieve an excellent step coverage on the tapered part of the opening, even when the deposition is made by a sputtering process. Thereby, a reliable electrical contact is achieved even when there is a severe undulation on the surface of the insulation layer and the opening is filled only partially by the conductive layer, as in the case of a multilayer interconnection structure.

By employing a sputter-etching process for rounding the upper edge of the opening, it is possible to form the tapered part while holding the substrate in the same deposition chamber of the same sputtering apparatus that is to be used for depositing the conductor layer subsequently to the formation of the conductive plug, without taking out the substrate away from the deposition chamber or breaking the vacuum. In other words, there is no need to increase the number of the fabrication steps for implementing the present invention.

By conducting the sputter-etching process after filling the opening by the conductive material, the sputter-etching process stops spontaneously upon exposure of the conductive material, and unlimited or uncontrolled expansion of the tapered part is effectively avoided, without external control of the sputter-etching process. As the sputter-etching process attacks only the upper edge of the opening, the problem such as non-uniform etching and variation of local etching rate as in the case of etching the insulation film over a wide area, does not appear in the present invention.

Other objects and further features of the present invention will become apparent from the following detailed description when read in conjunction with the attached drawings.

BRIEF DESCRIPTION OF THE DRAWINGS

FIGS. 6A and 6B are diagrams showing an example of undesirable modification of the present invention;

DETAILED DESCRIPTION OF THE PREFERRED EMBODIMENTS

Figure 4A:
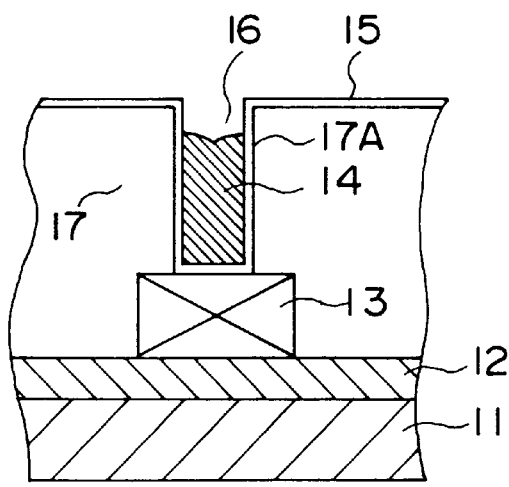
FIGS. 4A–4C are diagrams showing the fabrication process of a semiconductor device according to a first embodiment of the present invention.
Figure 4B:
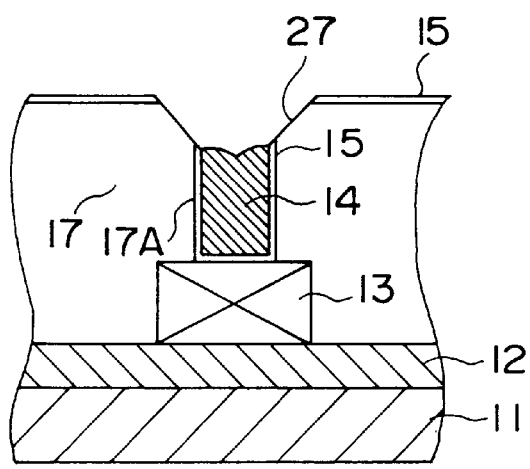
Figure 4C:
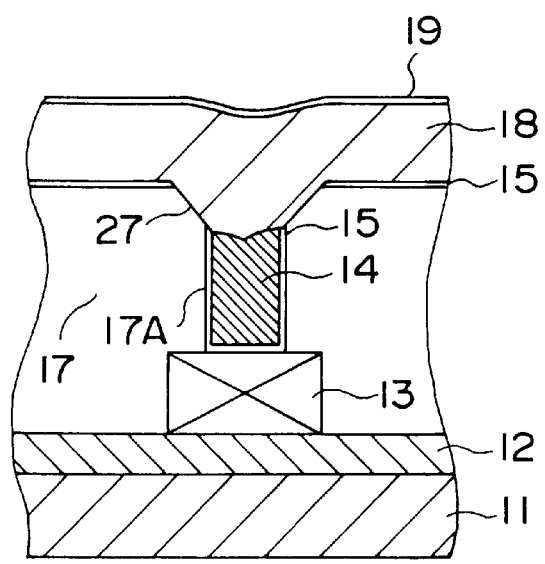

FIGS. 4A–4C show a semiconductor device according to a first embodiment of the present invention.

Referring to FIG. 4A, an oxide film 12 is deposited on a silicon substrate 11 typically by a CVD process. Further, a conductor layer of an Al-alloy is deposited on the oxide film 12 thus formed by a sputtering process. The sputter deposition of the Al-alloy layer may be made by using Al or an Al-alloy as a sputtering target. For example, the sputtering target may contain, in addition to Al, Si and Cu with respective amounts of 1% and 0.5% by weight. By patterning the Al-alloy layer thus formed, a conductor pattern 13 is formed, wherein the conductor pattern 13 forms a lower conductor pattern of the multilayer interconnection structure to be formed.

After the conductor pattern 13 is formed, an interlayer insulation film 17 of $SiO_2$ is deposited on the oxide film 12 as a part of the multilayer interconnection structure, such that the interlayer insulation film 17 covers or buries the conductor pattern 13 underneath. Typically, the interlayer insulation film 17 is formed by a plasma CVD process while using TEOS (tetraethylorthosilicate; $Si(OC_2H_5)_4$) and oxygen as the source materials of Si and O respectively. The interlayer insulation film 17 may be formed to have a thickness of about 900 nm.

After the interlayer insulation film 17 is thus formed, a contact hole 17A having a diameter of 0.5 $\mu$m is formed on the interlayer insulation film 17 such that the contact hole 17A penetrates through the interlayer insulation film 17, by applying a photolithographic patterning process.

Next, the substrate 11 thus processed and carrying thereon the insulation film 17 as well as the contact hole 17A is subjected to a reactive sputtering process, and an adhesion layer 15 of TiN is deposited such the TiN layer 15 covers the exposed upper major surface of the interlayer insulation film 17 as well as the inner wall of the contact hole 17A and further the exposed surface of the conductor pattern 13 that is exposed by the contact hole 17A. Typically, the reactive sputtering process is conducted by using a Ti target while supplying nitrogen as a reaction gas. The TiN layer 15 thus formed has a generally uniform thickness of about 50 nm.

Figure 1:
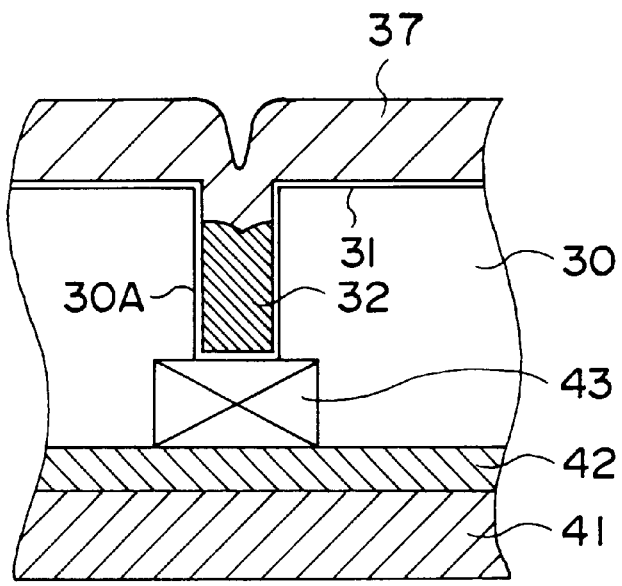
FIG. 1 is a diagram showing a part of a semiconductor device carrying a conventional multilayer interconnection structure.
Figure 2:
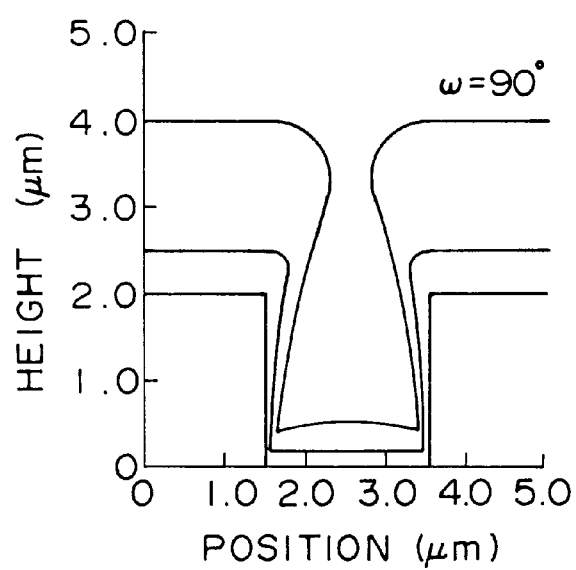
FIG. 2 is a diagram showing the step coverage of a vertical contact hole for a case in which the contact hole is filled by a sputtering process of a conductor layer.
Figure 3A:
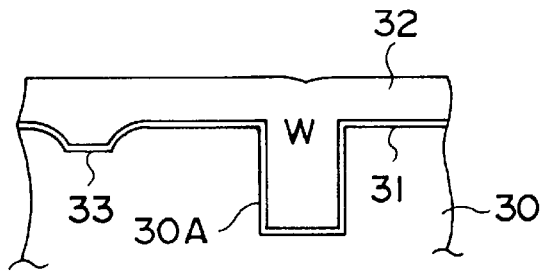
FIGS. 3A–3D are diagrams showing the fabrication process of the structure of FIG. 1.
Figure 3B:
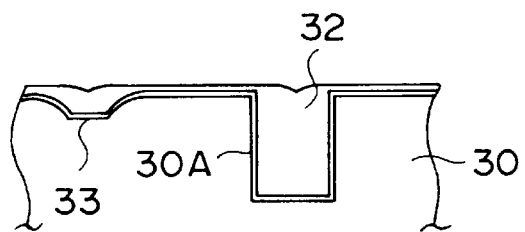

After the adhesion layer 15 is thus deposited, a W layer is deposited on the adhesion layer 15 by a low pressure CVD process of $WF_6$, such that the W layer fills the contact hole 17A. Therein, the deposition of the W layer is made at a substrate temperature of 450° C. under a pressure of 10 kPa, while supplying $WF_6$ and $H_2$ as the source materials. After the W layer is grown to a thickness of about 100 nm, the source materials are switched to $WF_6$ and $SiH_4$, and the deposition is continued further, such that a W layer is grown on the previously formed W layer with a thickness of about 700 nm. Thereby, a structure similar to the structure of FIG. 3A is obtained. As the deposition of the W layer is conducted by a vapor phase deposition process, the W layer thus deposited fills the foregoing contact hole 17A with an ideal step coverage.

Next, the substrate 11 thus processed is incorporated into an etching chamber of a dry etching apparatus, and an anisotropic etching process is applied to the W layer while supplying Ar and $SF_6$ to the etching chamber under the presence of an Ar plasma. The dry etching process is conducted such that the anisotropic etching acts substantially perpendicularly to the surface of the W layer, until the W layer covering the TiN layer 15 is removed. As a result of such an etch-back process, the part of the W layer remaining in the contact hole 17A forms a W plug 14.

Figure 3C:
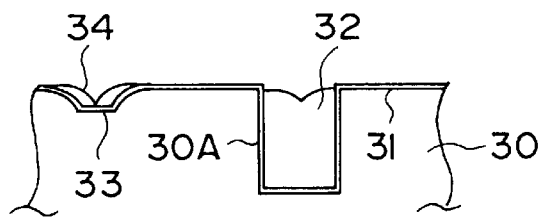
Figure 3D:
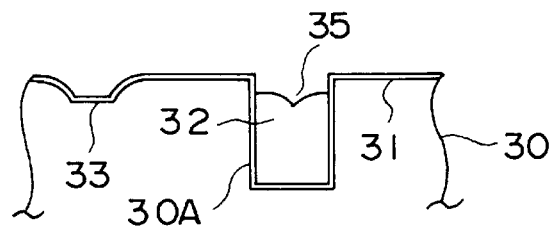

The dry etching process is continued further, even after the TiN layer 15 is exposed, such that any residual W pattern remaining in a depressed part of the insulation film 17, such as the one corresponding to the W pattern 34 of FIG. 3C, is eliminated. Such an excessive etching may be conducted by prolonging the duration of etching by 50% with respect to the duration required for removing the W layer from the flat surface of the insulation film 17. As a result of such an excessive etching, there appears a space 16 on the top part of the W plug 14 as indicated in FIG. 4A, wherein the space 16 may have a depth of about 200 nm.

Next, in the step of FIG. 4B, the structure of FIG. 4A is incorporated into a sputtering apparatus, and a sputter-etching process is applied under the following condition.
Ar flowrate 30 SCCM
pressure 0.26 Pa
substrate temperature: room temperature
RF power 400 W
duration 100 sec As a result of such a processing, the upper edge of the contact hole 17A is effectively rounded by the attacking of the Ar plasma, and there is formed a tapered part 27 in correspondence to the foregoing space 16 of FIG. 4A. As will be noted in FIG. 4B, the tapered part 27 is defined by an inclined side wall and has a diameter that increases gradually and progressively toward the upper major surface of the interlayer insulation film 17. As the W plug 14 is resistant against the sputter-etching process, the progress of the sputter-etching that causes an expansion of the tapered part 27 stops spontaneously in the state of FIG. 4B, where the tapered part 27 has reached the top part of the W plug 14. Thereby, the W plug 14 experiences no substantial damage by the sputter-etching.

Next, in the step of FIG. 4C, an Al-alloy layer 18 forming an upper conductor pattern of the multilayer interconnection structure is deposited by a sputtering process, while using the same sputtering apparatus used for forming the foregoing tapered part 27, without breaking the vacuum of the deposition chamber. After the deposition of the Al-alloy layer, a TiN layer is deposited on the layer 18 by a reactive sputtering process, which may be conducted in the same sputtering apparatus. The TiN layer 19 is used for an anti-reflection film at the time of photolithographic patterning of the Al-alloy layer 18.

As the structure of FIG. 4A includes the tapered part 27 on the top part of the W plug 14, an excellent step coverage is achieved for the Al-alloy layer 18, even when the layer 18 is deposited by a sputtering process.

The condition of sputtering is summarized as follows.

| Al-alloy (Al—Si—Cu alloy) | |
| --- | --- |
| Ar pressure | 0.26 Pa |
| substrate temperature | 250° C. |
| RF power | 5 kW |
| duration | 30 sec |
| TiN film | |
| Ar + N pressure | 0.33 Pa ($N_2$ = 40%) |
| substrate temperature | room temperature |
| RF power | 5 kW |
| duration | 40 sec |

Figure 5:
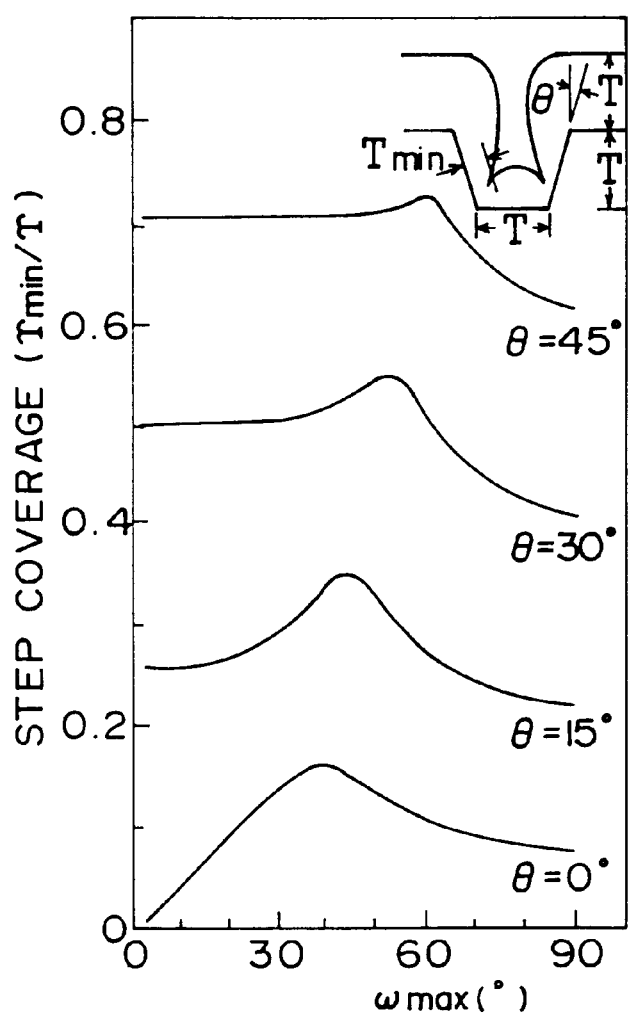
FIG. 5 is a diagram showing the step coverage of a tapered contact hole for a case in which the tapered contact hole is filled by a sputtering process of a conductor layer.

FIG. 5 shows the step coverage of a sputtered film over a tapered contact hole having various taper angles θ, as a function of the wraparound angle $\omega_{max}$ of the sputter particles. As will be noted, a slight increase of the taper angle θ significantly improves the step coverage.

The result of FIG. 5 indicates that the formation of the tapered part on the top part of the W plug 14 significantly improves the step coverage of the Al-alloy layer 18 filling the contact hole 17A. Associated with the improvement of the step coverage, the depression appearing on the top surface of the layer 18 is reduced, both in terms of the diameter and the depth.

In the foregoing embodiment, it should be noted that the formation of the W plug 14 is conducted prior to the formation of the tapered part 27. Thereby, the W plug 14 acts as an effective etching stopper for limiting the expansion of the tapered part 27 as already noted.

The multilayer interconnection structure of FIG. 4C is further subjected to a photolithographic patterning process for patterning the layers 18 and 19 to fabricate a semiconductor device, and the semiconductor device thus obtained is subjected to an evaluation process for evaluating the electrical resistance of the multilayer interconnection structure, by forming a pad electrode in continuation to the layer 18. It was confirmed that the multilayer interconnection structure shows a very small resistance. Further, it was confirmed that the yield of the multilayer interconnection structure is substantially 100%.

FIGS. 6A and 6B show what happens when the order of formation of the W plug and the tapered part 27 is reversed.

Referring to FIG. 6A showing a structure in which a W layer 14A is deposited on the interlayer insulation film 17 in which the contact hole 17A is formed with the tapered part 27, it will be noted that the W layer 14A filling the contact hole 17A shows a deep and conspicuous depression on the upper major surface thereof in correspondence to the foregoing tapered part 27, even when the size of the tapered part 27 is controlled successfully. In the illustrated example, the deposition of the layer 14A is made in plural times, with respective thicknesses $t_1$, $t_2$ and $t_3$. Associated with the deposition of the W layer 14A to fill the contact hole 17A, a so-called seam 14a is formed at the central part of the W plug filling the contact hole 17A due to the collision of the W layers that grow laterally from the opposing side walls of the contact hole 17A toward the center of the contact hole 17A. It should be noted that such a seam 17a includes numerous defects and tends to cause the problem of disconnection or increase of resistance.

When an etch-back process is applied to the structure of FIG. 6A, one obtains a structure of FIG. 6B, in which it will be noted that the W plug 14 filling the contact hole 17A experiences a severe etching particularly along the foregoing seam 14a, and the problem of poor reliability of contact is pronounced. By filling the contact hole 17A prior to the formation of the tapered part 27, the present invention successfully avoids the problem.

Further, by controlling the height of the plug 14 by controlling the duration of the excessive etching applied to the W plug 14, it is possible to control the size and depth of the tapered part 27 of the contact hole 17A. As already noted, the growth or expansion of the tapered part 27 stops spontaneously when the tapered surface has reached the top edge of the W plug 14.

Figure 7:
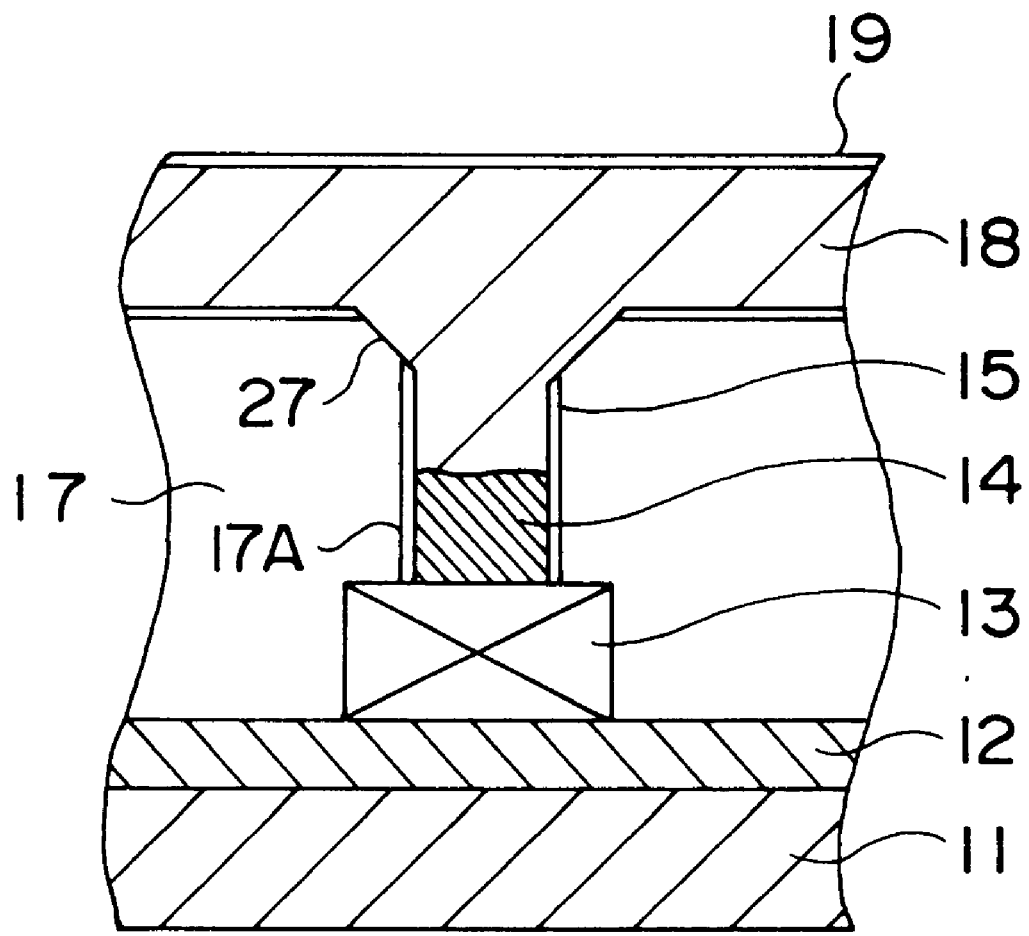
FIG. 7 is a diagram showing the construction of a semiconductor device according to a second embodiment of the present invention.

FIG. 7 shows the structure of a multilayered interconnection structure according to a second embodiment of the present invention. In the present embodiment, the duration of the excessive etching applied to the W plug 14 is increased to 120% as compared with the previous example of 50%.

Referring to FIG. 7, it will be noted that the W plug 14 fills only 50% of the length of the contact hole 17A extending from the upper major surface to the lower major surface of the interlayer insulation film 17, and the tapered part 27 is formed only at the top edge part of the contact hole 17A. The tapered part 27 is formed by a sputter-etching process under the condition as follows.

| Ar flowrate | 30 SCCM |
| pressure | 0.26 Pa |
| substrate temperature | room temperature |
| RF power | 450 W |
| duration | 120 sec |

After the tapered part 27 is formed as such, the deposition of the conductor layer 18 is conducted by applying a high temperature sputtering process of an Al-alloy in the same deposition chamber of the same sputtering apparatus, without breaking the vacuum in the deposition chamber. The deposition of the conductor layer 18 is conducted in two steps as follows.

| first step | |
| --- | --- |
| Ar pressure | 0.26 Pa |
| substrate temperature | 250° C. |
| RF power | 5 kW |
| duration | 15 sec |
| second step | |
| Ar pressure | 0.26 Pa |
| substrate temperature | 450° C. |
| RF power | 5 kW |
| duration | 25 sec |

The conductor layer 18 thus formed by the high temperature sputtering process shows a further improved step coverage, and the depression formed on the top surface of the layer 18 in correspondence to the contact hole 17A vanishes substantially.

After the conductor layer 18 is formed as such, the TiN anti-reflection film 19 is formed similarly as before.

Figure 8:
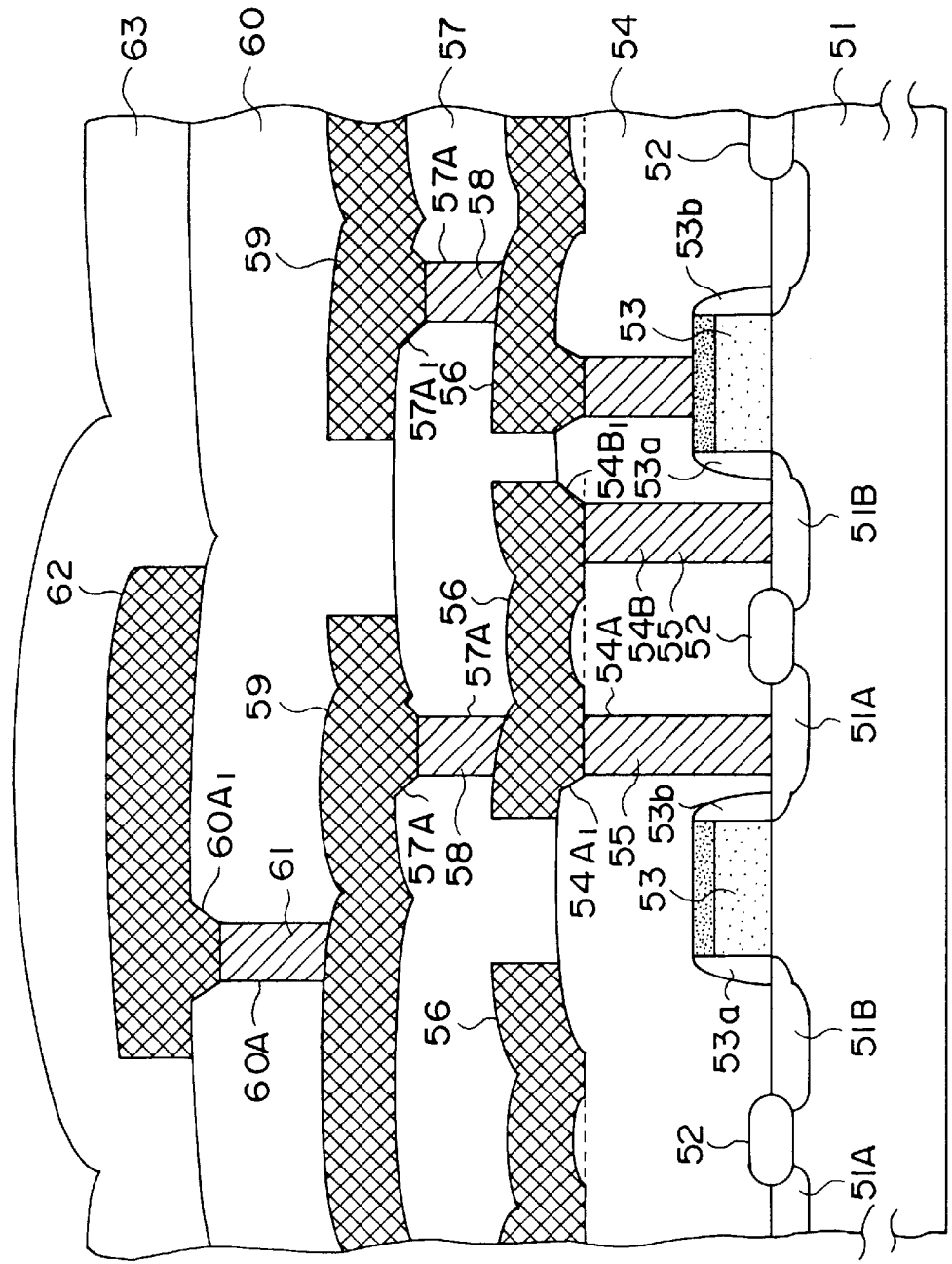
FIG. 8 is a diagram showing the construction of a semiconductor device according to a third embodiment of the present invention.

FIG. 8 shows the construction of a semiconductor integrated circuit that uses a multilayer interconnection structure of the present invention.

Referring to FIG. 8, the semiconductor integrated circuit is constructed on a Si substrate 51, wherein the Si substrate 51 carries a field oxide film 52 that defines an active region for each of the semiconductor devices to be formed in the integrated circuit.

In each of the active regions, the Si substrate 51 is formed with a first diffusion region 51A and a second diffusion region 51B of the $p^+$-type or $n^+$-type, and a gate electrode 53 is provided on the Si substrate between the first and second diffusion regions 51A and 51B in each of the active regions, wherein the gate electrode 53 is covered laterally by side wall insulation oxides 53a and 53b.

The gate electrode 53 is buried under an interlayer insulation film 54 of $SiO_2$ or other suitable silicate glass such as PSG (phosphosilicate glass) or BPSG (borophosphosilicate glass), wherein contact holes 54A and 54B are formed in the interlayer insulation film 54 such that each of the contact holes extends from the upper major surface to the lower major surface of the interlayer insulation film 54 and exposes the diffusion region 51A or the diffusion region 51B.

The contact hole 54A or 54B is filled partially by a W plug 55 and includes a tapered part $54A_1$ or $54B_1$ at the top part thereof, wherein the tapered part $54A_1$ or $54B_1$ is filled by a lower conductor pattern 56 of Al or an Al-alloy, and the conductor pattern 56 fills the tapered part $54A_1$ or $54B_1$ in contact with the W plug 55 in the contact hole 54A or 54B.

The lower conductor pattern 56 is covered by another interlayer insulation film 57 of $SiO_2$ or other suitable silicate glass such as PSG or BPSG, and a contact hole 57A is formed so as to expose the lower conductor pattern 56. The contact hole 57A is filled partially by a W plug 58, and the unfilled part of the contact hole 57A forms a tapered part 57A$_1$. The tapered part 57A$_1$ is filled by an intermediate conductor pattern 59 of Al or an Al-alloy.

The intermediate conductor pattern 59 is buried under another interlayer insulation film 60 of $SiO_2$ or other suitable silicate glass such as PSG or BPSG, and a contact hole 60A is formed so as to expose the intermediate conductor pattern 59. The contact hole 60A is filled partially by a W plug 61, and the unfilled part of the contact hole 60A forms a tapered part 60A$_1$. The tapered part 60A$_1$ is filled by an upper conductor pattern 62 of Al or an Al-alloy. Further, a protective film of $SiO_2$ is provided so as to cover the upper conductor pattern 62.

In the structure of FIG. 8, the tapered part such as 54A$_1$, 54B$_1$, 57A$_1$ or 60A$_1$ is formed by a sputter-etching process similarly to the embodiments described previously. By depositing the lower conductor pattern 56, the intermediate conductor pattern 59 or the upper conductor pattern 62 by a sputtering process as described already, the tapered part is filled with an excellent step coverage, and a reliable electrical contact is obtained for any of the contact holes included in the multilayer interconnection structure.

In the foregoing description, it is explained that the conductor layer such as the layer 18 is deposited, subsequently to the sputter-etching process, by a sputtering process. However, the deposition of the conductor layer is by no means limited to such a sputtering process, but a plasma CVD process including a bias-ECR (electron cyclotron resonance) plasma CVD process may also be employed. It should be noted that any of these processes enables to carry out a sputter-etching process, in advance to the deposition of the conductor layer, to form the tapered part while using the same deposition chamber in which the plasma deposition of the conductor layer is to be made.

Further, the conductor layer 18 is by no means limited to the Al-alloy containing Si and Cu but may have a difference composition. Similarly, the adhesion layer 15 is not limited to TiN but any conductive compound containing a refractory element may be used.

Further, the present invention is by no means limited to the embodiments described heretofore, but various variations and modifications may be made without departing from the scope of the invention.

What is claimed is:

1. A method of fabricating a semiconductor device, said semiconductor device comprising a substrate and an interconnection structure provided on said substrate, said interconnection structure including an insulation film and a plurality of openings formed in said insulation film such that said openings extend from an upper major surface of said insulation film toward a lower major surface of said insulation film, said method comprising the steps of:

(A) overfilling said openings by a conductive material and overetching such that said conductive material fills said openings from a bottom edge of said openings to a level below a top edge of said openings;

(B) applying, after said step (A), a sputter-etching process to said insulation film, such that only an upper edge of each of said openings is removed, said contact hole thereby forming a tapered part above said level, such that a diameter of said openings increases continuously and gradually, in said tapered part, toward said upper major surface of said insulation film;

(C) depositing, after said step (B), a conductor layer on said insulation film such that said conductor layer fills said tapered part of said openings in contact with said conductive material filling said openings.

2. A method as claimed in claim 1, wherein said step (A) fills said opening by W as said conductive material.

3. A method as claimed in claim 2, wherein said step of filling said opening by W is conducted by a vapor phase deposition process.

4. A method as claimed in claim 2, wherein said step (A) includes a step of covering said upper major surface of said insulation film by a conductive material containing a refractory element, before filling said opening by W.

5. A method as claimed in claim 4, wherein said step of covering said major surface of said insulation film includes a step of depositing TiN on said upper major surface of said insulation film.

6. A method as claimed in claim 1, wherein said step (C) includes a step of depositing a metal containing Al as a primary element as said conductor layer by a high temperature sputtering process.

7. A method as claimed in claim 1, wherein said step (B) and said step (C) are carried out commonly in a reaction chamber of a deposition apparatus including a plasma generator.

8. A method as claimed in claim 7, wherein said deposition apparatus is a sputtering apparatus.

* * * * *